United States Patent
Ishida et al.

(10) Patent No.: US 10,773,309 B2
(45) Date of Patent: Sep. 15, 2020

(54) THREE-DIMENSIONAL PRODUCTION METHOD FOR FUNCTIONAL ELEMENT STRUCTURE BODY AND FUNCTIONAL ELEMENT STRUCTURE BODY

(71) Applicant: SEIKO EPSON CORPORATION, Tokyo (JP)

(72) Inventors: Masaya Ishida, Hara-mura (JP); Tomoyuki Kamakura, Matsumoto (JP); Eiji Okamoto, Matsumoto (JP); Takeshi Miyashita, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 294 days.

(21) Appl. No.: 15/414,192

(22) Filed: Jan. 24, 2017

(65) Prior Publication Data
US 2017/0209931 A1    Jul. 27, 2017

(30) Foreign Application Priority Data
Jan. 26, 2016    (JP) ................................ 2016-012611

(51) Int. Cl.
*B22F 7/00*    (2006.01)
*B33Y 80/00*    (2015.01)
(Continued)

(52) U.S. Cl.
CPC .............. *B22F 7/008* (2013.01); *B22F 3/008* (2013.01); *B22F 3/1055* (2013.01); *B22F 5/00* (2013.01);
(Continued)

(58) Field of Classification Search
CPC combination set(s) only.
See application file for complete search history.

(56) References Cited

U.S. PATENT DOCUMENTS

| 5,204,055 A | 4/1993 | Sachs et al. |
| 6,363,606 B1 | 4/2002 | Johnson, Jr. et al. |

(Continued)

FOREIGN PATENT DOCUMENTS

| JP | 06-218712 | 8/1994 |
| JP | 2014-227587 | 12/2014 |

(Continued)

OTHER PUBLICATIONS

"Zirconia Toughened Alumina (ZTA)," INASCO, Inc. (2014). (Year: 2014).*

(Continued)

*Primary Examiner* — Catherine S Branch
(74) *Attorney, Agent, or Firm* — Workman Nydegger (57) ABSTRACT

A three-dimensional production method for a functional element structure body according to the invention is a three-dimensional production method for a functional element structure body, which includes an electrical functional element section having a terminal and an insulating member provided on the periphery of the functional element section in a state where at least the terminal is exposed to the outside, and includes a layer formation step of forming one layer in a layer forming region by supplying a first flowable composition containing first particles for the functional element section from a first supply section, and supplying a second flowable composition containing second particles for the insulating member from a second supply section, a shaping step of shaping the functional element structure body by repeating the layer formation step, and a solidification step of performing solidification by applying energy to the first particles and the second particles in the layer.

9 Claims, 9 Drawing Sheets

(51) Int. Cl.

| | | |
|---|---|---|
| B33Y 70/00 | (2020.01) | |
| B29C 67/00 | (2017.01) | |
| B22F 5/00 | (2006.01) | |
| B23K 26/342 | (2014.01) | |
| B28B 1/00 | (2006.01) | |
| B33Y 10/00 | (2015.01) | |
| B22F 3/105 | (2006.01) | |
| B22F 5/12 | (2006.01) | |
| B22F 3/00 | (2006.01) | |
| H05K 3/12 | (2006.01) | |
| B29C 64/165 | (2017.01) | |
| B29C 64/153 | (2017.01) | |
| H05K 3/28 | (2006.01) | |
| B29K 105/16 | (2006.01) | |
| B29K 505/00 | (2006.01) | |
| B29K 509/02 | (2006.01) | |
| H01L 23/34 | (2006.01) | |
| H01L 49/02 | (2006.01) | |
| H01L 29/861 | (2006.01) | |
| H01L 29/70 | (2006.01) | |
| B23K 101/40 | (2006.01) | |
| B23K 103/16 | (2006.01) | |
| H05K 1/16 | (2006.01) | |
| B41J 3/407 | (2006.01) | |

(52) U.S. Cl.
CPC .............. *B22F 5/12* (2013.01); *B23K 26/342* (2015.10); *B28B 1/001* (2013.01); *B29C 64/153* (2017.08); *B29C 64/165* (2017.08); *B33Y 10/00* (2014.12); *B33Y 80/00* (2014.12); *H05K 3/1275* (2013.01); *H05K 3/28* (2013.01); *B22F 2003/1058* (2013.01); *B22F 2998/10* (2013.01); *B23K 2101/40* (2018.08); *B23K 2103/16* (2018.08); *B29K 2105/16* (2013.01); *B29K 2505/00* (2013.01); *B29K 2509/02* (2013.01); *B41J 3/4073* (2013.01); *H01L 23/345* (2013.01); *H01L 28/10* (2013.01); *H01L 28/20* (2013.01); *H01L 28/40* (2013.01); *H01L 29/70* (2013.01); *H01L 29/861* (2013.01); *H05K 1/162* (2013.01); *H05K 1/165* (2013.01); *H05K 1/167* (2013.01); *Y02P 10/295* (2015.11)

(56) References Cited

U.S. PATENT DOCUMENTS

| | | |
|---|---|---|
| 2007/0003781 A1 | 1/2007 | De Rochemont |
| 2009/0004381 A1 | 1/2009 | Fujisawa et al. |
| 2015/0201500 A1 | 7/2015 | Shinar et al. |
| 2015/0306664 A1 | 10/2015 | Aklint et al. |
| 2015/0352785 A1 | 12/2015 | Folgar et al. |
| 2016/0074938 A1 | 3/2016 | Kitani et al. |
| 2018/0272601 A1* | 9/2018 | Erickson ................ B29C 67/00 |
| 2018/0295728 A1* | 10/2018 | Yudovin-Farber .......................... B29C 64/112 |

FOREIGN PATENT DOCUMENTS

| | | |
|---|---|---|
| JP | 2015-081380 | 4/2015 |
| WO | 2016/18515 A1 | 11/2016 |

OTHER PUBLICATIONS

European Search Report for Application No. 17153189.0 dated Jun. 16, 2017.

* cited by examiner

THREE-DIMENSIONAL PRODUCTION METHOD FOR FUNCTIONAL ELEMENT STRUCTURE BODY AND FUNCTIONAL ELEMENT STRUCTURE BODY

BACKGROUND

1. Technical Field

The present invention relates to a three-dimensional production method for a functional element structure body such as a heater, a resistor, a capacitor, a strain sensor, or a transistor, and a functional element structure body.

2. Related Art

JP-A-2014-227587 (Patent Document 1) discloses a production method for a three-dimensional structure material. In Patent Document 1, a production method for a three-dimensional shaped article including a mixing step of mixing a first metal powder P1 with a second metal powder P2 which is different from the first metal powder P1 thereby obtaining a mixed powder of different metals, and a shaping step of sintering, or melting and solidifying the mixed powder of different metals obtained in the mixing step is described. It is described that based on a region of the three-dimensional shaped article to be produced, the mixing ratio of the first metal powder P1 to the second metal powder P2 is changed in the mixing step.

Figure 5:
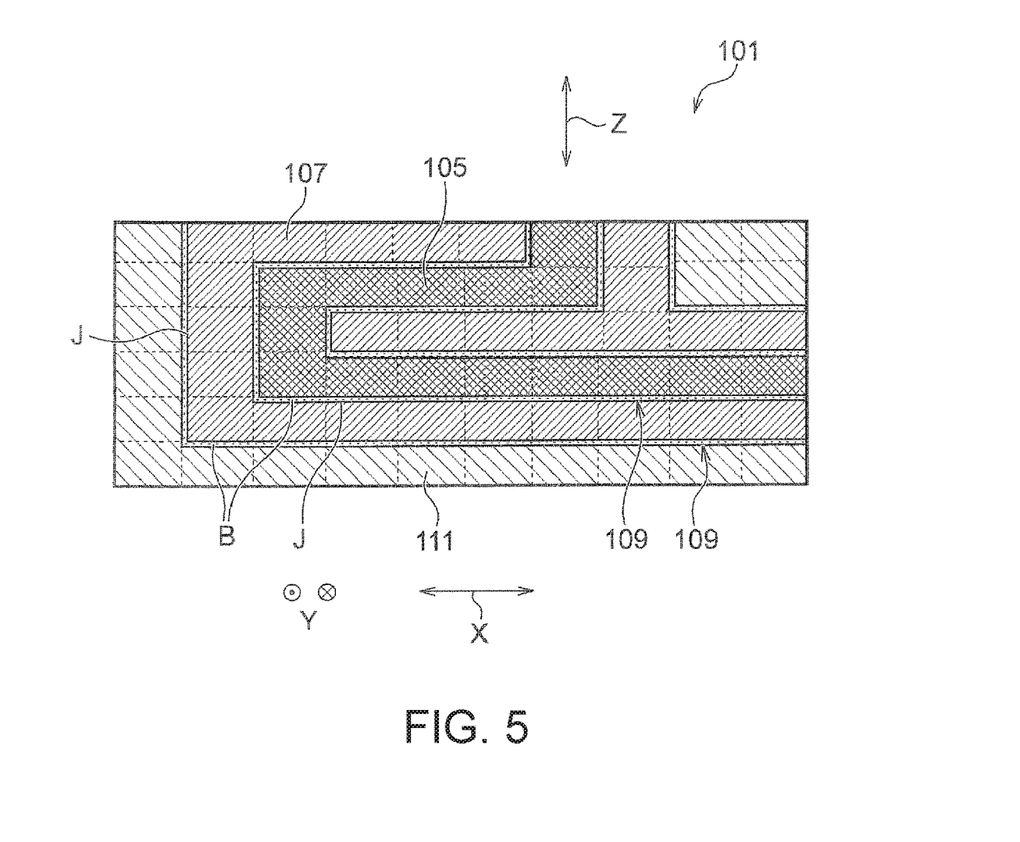
FIG. 5 is an enlarged cross-sectional view of a portion of a functional element structure body in the related art.

On the other hand, a functional element structure body such as a heater, a resistor, a capacitor, a strain sensor, or a transistor has been widely used. As shown in FIG. 5, such a functional element structure body 101 includes a functional element section 105 which exhibits its own function, and an insulating member 107 provided on the periphery of the functional element section 105 so as to cover it. Further, on the periphery of the insulating member 107, an external constituent member 111 to serve as a housing is generally provided. There also exists a functional element structure body 101 in which the insulating member 107 also functions as the external constituent member 111 as such.

As shown in FIG. 5, the functional element structure body 101 has a structure in which the functional element section 105 and the insulating member 107 are separately produced and assembled using a screw or an adhesive B, and therefore has a structure in which the contact regions 109 of these members are generally merely in surface contact with each other or a structure in which the contact regions 109 of these members are bonded to each other with the adhesive B. In this case, in the "structure in which the contact regions 109 of these members are merely in contact with each other", the holding state of the functional element section 105 becomes unstable, and in the "structure in which the contact regions 109 of these members are bonded to each other with the adhesive B", there is a problem that the adhesion state of the bond part is deteriorated over time and therefore there is a fear that the property of the functional element section 105 becomes unstable. Further, also, as the adhesive B, an adhesive dedicated to the functional element section 105 is sometimes needed, and the production is not easy and the number of assembling workloads is large, and therefore, it has a problem that the cost of the functional element structure body 101 is increased.

However, the Patent Document 1 does not describe or suggest that the functional element structure body 101 including the functional element section 105 such as a heater, a resistor, or a capacitor is produced by a three-dimensional shaping method.

SUMMARY

An advantage of some aspects of the invention is to reduce the fear that the property of a functional element structure body becomes unstable.

A three-dimensional production method for a functional element structure body according to a first aspect of the invention is a three-dimensional production method for a functional element structure body including an electrical functional element section having a terminal and an insulating member provided on the periphery of the functional element section in a state where at least the terminal is exposed to the outside, and includes a layer formation step of forming one layer in a layer forming region by supplying a first flowable composition containing first particles to serve as a material for the functional element section from a first supply section to a predetermined region, and supplying a second flowable composition containing second particles to serve as a material for the insulating member from a second supply section to a predetermined region, a shaping step of shaping the functional element structure body by repeating the layer formation step in a stacking direction, and a solidification step of performing solidification by applying energy to the first particles and the second particles in the layer.

The "functional element structure body" as used herein refers to an electrical component, in which an element portion (a functional element section) that exhibits an electrical function such as a heater, a resistor, a capacitor, a strain sensor, or a transistor is covered with an insulating member in a state where a terminal is extended to the outside, and which comes to be able to exhibit the electrical function by being brought to a state where the terminal is connected to a power supply. Incidentally, the "state of being covered with an insulating member" is used in the sense of also including a structure in which apart of the functional element section is not covered within a range where the electrical function is not affected.

Here, the "insulating member provided on the periphery of the functional element section" is used in the sense of also including a structure in which the insulating member is provided not on the entire periphery of the functional element section. Further, the functional element structure body may have a structure in which an external constituent member (housing) is further provided outside the insulating member.

According to the aspect of the invention, by using a three-dimensional shaping method, the material for the functional element section (first particles) and the material for the insulating member (second particles) are solidified by applying energy in a state where these materials are in contact with each other in the shaping process, and therefore, the structure body does not have a structure in which the contact regions of the functional element section and the insulating member are in a state of being merely in surface contact with each other or are bonded to each other with an adhesive, but the respective materials of the functional element section and the insulating member are systematically connected with each other and thus integrally bonded to each other without seams. As a result, the holding of the functional element section is prevented from becoming unstable, and also a problem such as deterioration of the adhesive in the bond part which occurs in the related art does not occur, and thus, the fear that the property of the functional element section becomes unstable can be reduced. Moreover, the production is easy and the number of assembling workloads can be decreased, and therefore, the increase in the cost of the functional element structure body can be suppressed.

A three-dimensional production method for a functional element structure body according to a second aspect of the invention is directed to the first aspect, in which at least one of the first supply section and the second supply section ejects the flowable composition in a liquid droplet state.

According to this aspect of the invention, the flowable composition is ejected in a liquid droplet state, and therefore, the existing ratio of the respective materials in the contact regions of the functional element section and the insulating member can be gradually changed. For example, by ejecting the flowable composition so as to gradually decrease the existing ratio of the material for the functional element section toward the insulating member side, and to gradually decrease the existing ratio of the other material for the insulating member toward the functional element section side, the respective materials in the bond regions thereof can be made to exist in a gradient state.

According to this configuration, a structure in which the respective materials of the functional element section and the insulating member are systematically connected with each other and thus integrally bonded to each other without seams can be realized.

A three-dimensional production method for a functional element structure body according to a third aspect of the invention is directed to the first or second aspect, in which the first particles include metal particles, and the second particles include ceramic particles.

According to this aspect of the invention, by using such materials, the electrical conductivity of the functional element section and the insulating property of the insulating member can be ensured, and thus, the functional element structure body having any of various electrical functions can be produced.

A three-dimensional production method for a functional element structure body according to a fourth aspect of the invention is directed to the third aspect, in which the second particles include ceramic particles and other ceramic particles different from the ceramic particles.

According to this aspect of the invention, the second particles include ceramic particles and other ceramic particles different from the ceramic particles, and therefore, by appropriately selecting the type of the other ceramic particles, a new functional element structure body in which a property as a dielectric material is imparted to the insulating member can be produced.

A three-dimensional production method for a functional element structure body according to a fifth aspect of the invention is directed to any one of the first to fourth aspects, in which the solidification step is performed every time when the layer is formed.

According to this aspect of the invention, the solidification step is performed every time when the layer is formed, and therefore, the systematic connection structure can be easily realized for each layer.

A three-dimensional production method for a functional element structure body according to a sixth aspect of the invention is directed to any one of the first to fifth aspects, in which the melting point of the second particles is higher than the melting point of the first particles.

According to this aspect of the invention, the melting point of the second particles is higher than the melting point of the first particles, and therefore, it is possible to sinter the insulating member on the periphery and to melt and solidify the functional element section in the inside. According to this, the application of energy in the solidification step can be effectively performed.

A three-dimensional production method for a functional element structure body according to a seventh aspect of the invention is directed to any one of the first to sixth aspects, in which the functional element section has a passive element as the functional element.

According to this aspect of the invention, a functional element structure body having a passive element such as a heater, a resistor, a capacitor, or a coil can be easily produced.

A three-dimensional production method for a functional element structure body according to an eighth aspect of the invention is directed to any one of the first to sixth aspects, in which the functional element section has an active element as the functional element.

According to this aspect of the invention, a functional element structure body having an active element such as a transistor or a diode can be easily produced.

A three-dimensional production method for a functional element structure body according to a ninth aspect of the invention is directed to the first to sixth aspects, in which the functional element section has a plurality of functional elements including a passive element and an active element as the functional element.

According to this aspect of the invention, a functional element structure body including both of a passive element and an active element can be easily produced.

A functional element structure body according to a tenth aspect of the invention is a functional element structure body including an electrical functional element section having a terminal, and an insulating member provided on the periphery of the functional element section in a state where at least the terminal is exposed to the outside, wherein the functional element section and the insulating member are configured such that the contact regions thereof are seamlessly formed.

Here, the phrase "seamlessly formed" does not mean a structure in which the contact regions of the functional element section and the insulating member are in a state of being merely in surface contact with each other or are bonded to each other with an adhesive, but means a structure in which the respective materials of the functional element section and the insulating member are systematically connected with each other and thus integrally bonded to each other without seams. In other words, this means a structure in which the functional element section and the insulating member are integrally bonded to each other without seams through the respective materials.

According to this aspect of the invention, the structure body does not have a structure in which the contact regions of the functional element section and the insulating member are in a state of being merely in surface contact with each other or are bonded to each other with an adhesive, but have a seamless structure in which the respective materials of the functional element section and the insulating member are systematically connected with each other and thus integrally bonded to each other without seams. As a result, the holding of the functional element section is no longer unstable, and also a problem such as deterioration of the adhesive in the bond part which occurs in the related art does not occur, and thus, the fear that the property of the functional element section becomes unstable can be reduced.

This seamless structure can be realized by, for example, applying energy in a state where the respective materials of the functional element section and the insulating member are in contact with each other to sinter or melt the materials.

A functional element structure body according to an eleventh aspect of the invention is directed to the tenth aspect, in which the functional element structure body includes an external constituent member to serve as a housing, and the functional element section and the insulating member are configured such that also the contact regions thereof with the external constituent member are seamlessly formed.

According to this aspect of the invention, in the functional element structure body including the external constituent member to serve as a housing, the same effect as that of the tenth aspect of the invention can be obtained also for the contact regions thereof with the external constituent member.

A functional element structure body according to a twelfth aspect of the invention is directed to the tenth or eleventh aspect, in which the functional element section has a passive element as the functional element.

According to this aspect of the invention, the property of the functional element structure body having a passive element such as a heater, a resistor, a capacitor, or a coil can be stabilized.

A functional element structure body according to a thirteenth aspect of the invention is directed to the tenth or eleventh aspect, in which the functional element section has an active element as the functional element.

According to this aspect of the invention, the property of the functional element structure body having an active element such as a transistor or a diode can be stabilized.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a three-dimensional production method for a functional element structure body and a functional element structure body according to an embodiment of the invention will be described in detail with reference to the accompanying drawings.

In the following description, first, the overall configuration of the functional element structure body according to an embodiment of the invention will be described, and a difference in the structure between the functional element structure body and a functional element structure body in the related art will be mentioned. Next, the schematic configuration of a three-dimensional production apparatus for a functional element structure body to be used for the three-dimensional production method for a functional element structure body according to an embodiment of the invention will be described, and then, the contents of the three-dimensional production method for a functional element structure body of the invention to be performed using the three-dimensional production apparatus for a functional element structure body will be specifically described. Further, finally, other embodiments of the three-dimensional production method for a functional element structure body and the functional element structure body according to the invention having a configuration partially different from that of the embodiment will be mentioned.

(1) Overall Configuration of Functional Element Structure Body (see FIGS. 1 to 4 and 11 to 13)

A functional element structure body 1 according to the invention is basically configured to include an electrical functional element section 5 having a terminal 3, and an insulating member 7 provided on the periphery of the functional element section 5 in a state where at least the terminal 3 is exposed to the outside.

As the characteristic configuration of the invention, the functional element section 5 and the insulating member 7 are configured such that the contact regions 9 thereof are seamlessly formed. Here, the phrase "seamlessly formed" does not mean a structure in which the contact regions 9 of the functional element section 5 and the insulating member 7 are in a state of being merely in surface contact with each other or are bonded to each other with an adhesive B, but means a structure in which the respective materials of the functional element section 5 and the insulating member 7 are systematically connected with each other and thus integrally bonded to each other without seams J (see FIG. 5). In other words, this means a structure in which the functional element section 5 and the insulating member 7 are integrally bonded to each other without seams J through the respective materials.

Further, in this embodiment, the functional element structure body 1 includes an external constituent member 11 (see FIGS. 2 and 3) to serve as a housing, and the functional element section 5 and the insulating member 7 are configured such that also the contact regions 9 thereof with the external constituent member 11 are seamlessly formed.

The functional element section 5 is a portion which makes the functional element structure body 1 exhibit a given electrical function, and is configured to include a functional element 13 which directly exhibits the function, the above-mentioned terminal 3 which serves as an electrical contact point with an external power supply, and a connection section 15 which connects the functional element 13 with the terminal 3.

Figure 11:
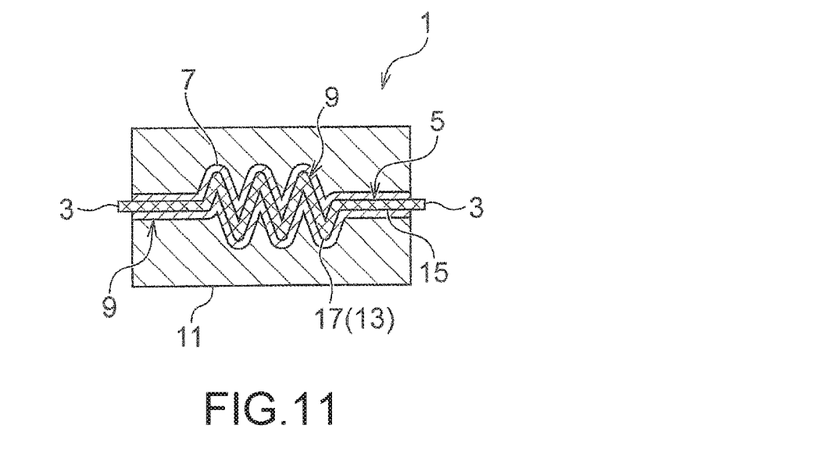
FIG. 11 is an explanatory view showing a functional element structure body in which a passive element is applied to a functional element section.
Figure 12:
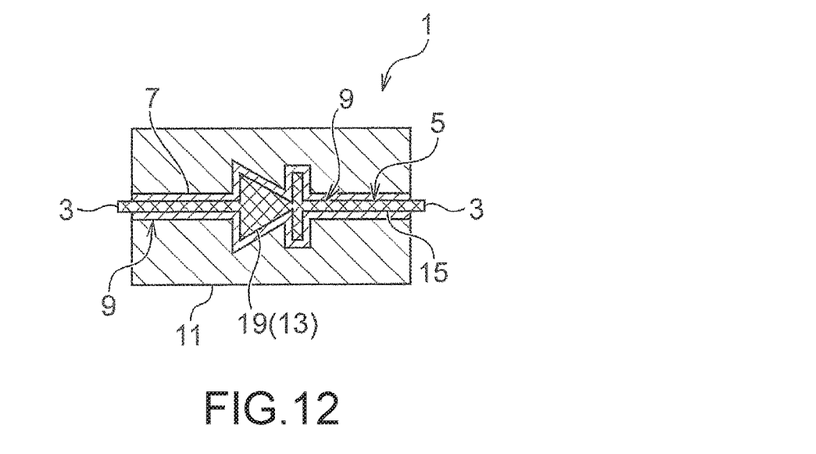
FIG. 12 is an explanatory view showing a functional element structure body in which an active element is applied to a functional element section.
Figure 13:
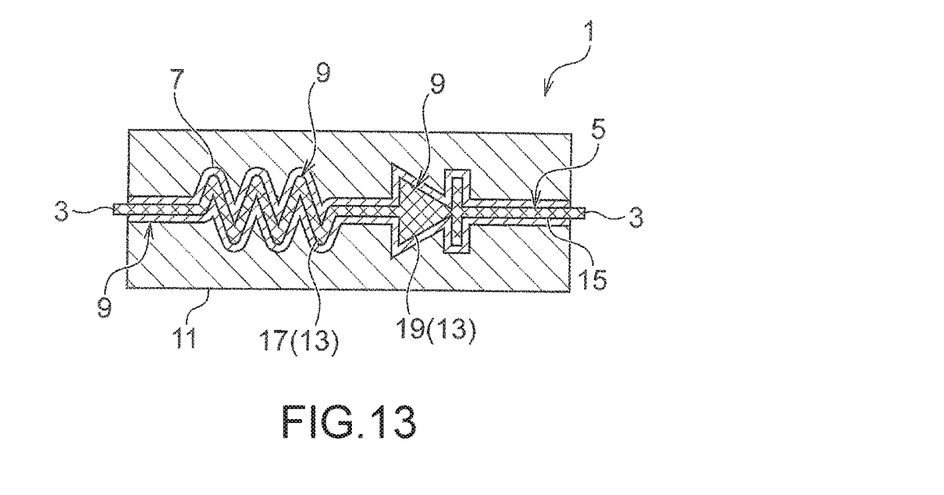
FIG. 13 is an explanatory view showing a functional element structure body in which a passive element and an active element are applied to a functional element section.

As the functional element 13, a passive element 17 such as a resistor, a heater, a capacitor, or a coil shown in FIG. 11 or an active element 19 such as a diode or a transistor shown in FIG. 12 can be applied, and further, as shown in FIG. 13, it can be configured to include a plurality of functional elements 13 including a passive element 17 and an active element 19.

Figure 1:
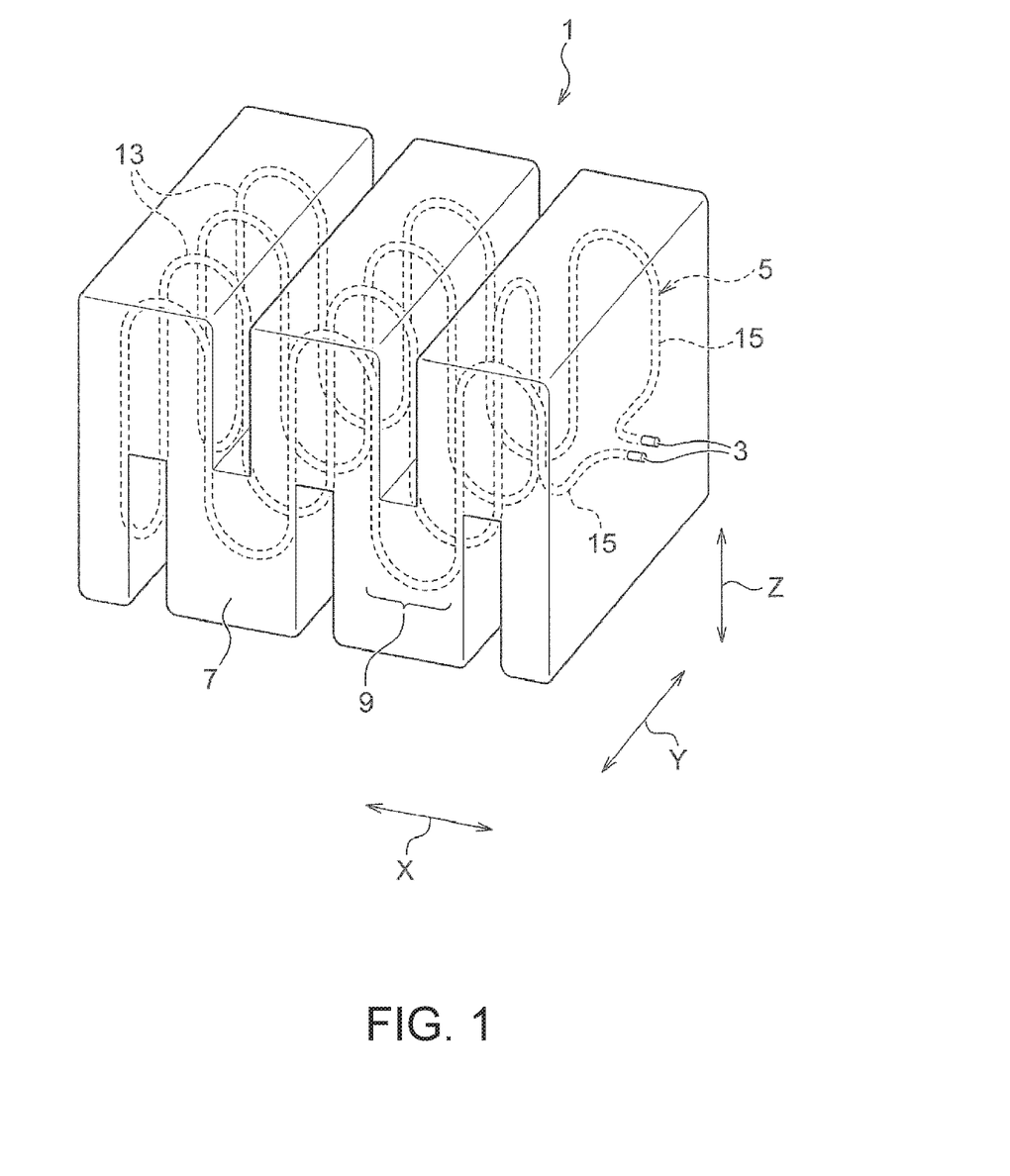
FIG. 1 is a perspective view showing a functional element structure body according to an embodiment of the invention.
Figure 2:
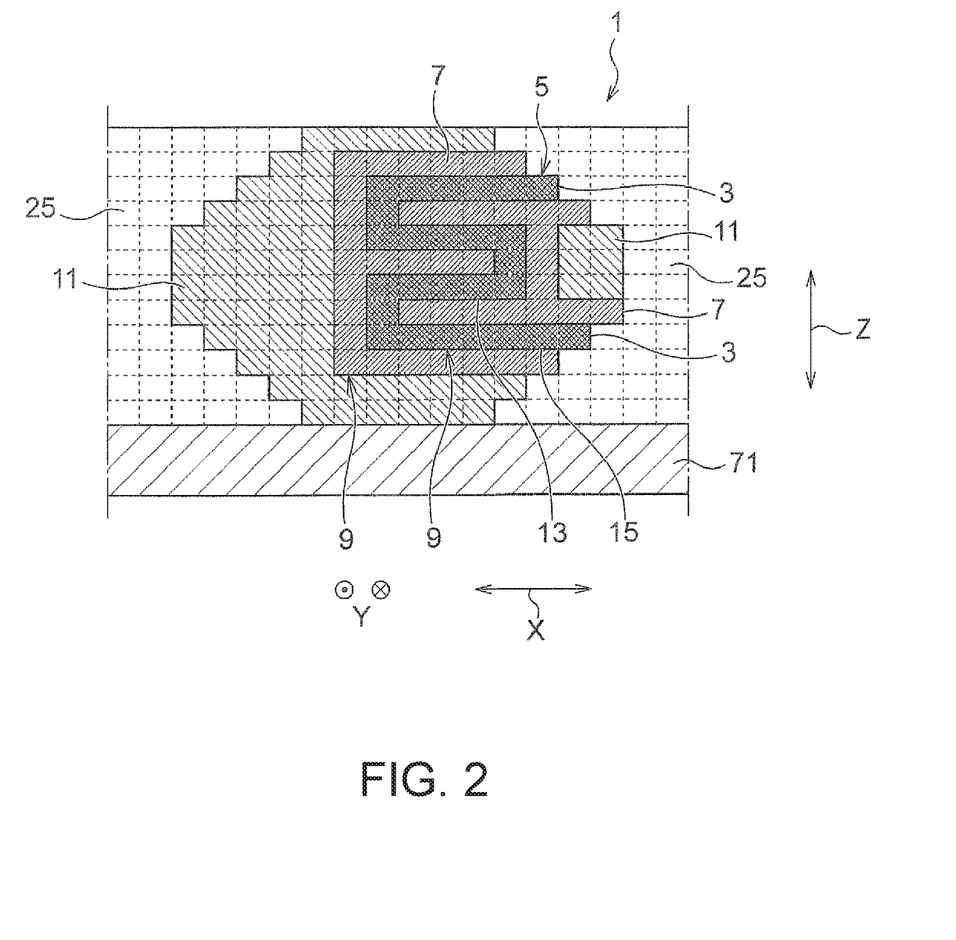
FIG. 2 is a cross-sectional view showing a state during production of a functional element structure body according to an embodiment of the invention.
Figure 3:
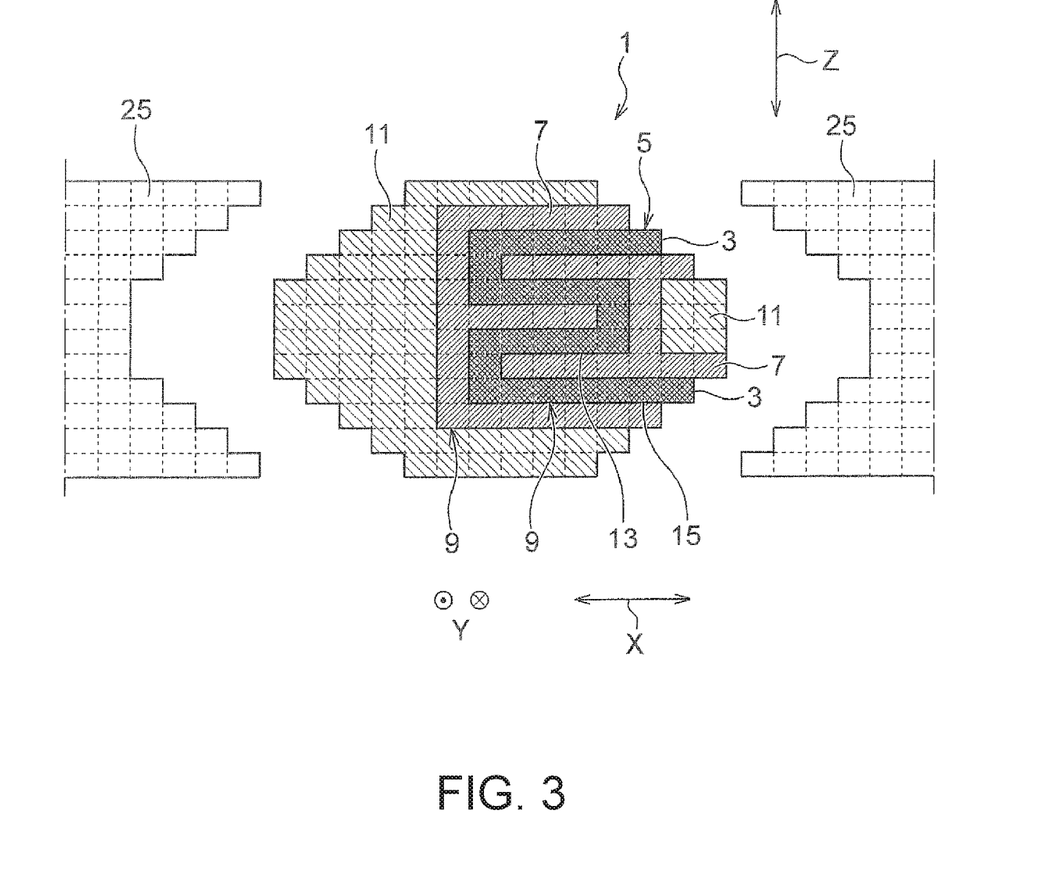
FIG. 3 is a cross-sectional view showing a completed state of a functional element structure body according to an embodiment of the invention.

As a material for forming the functional element section 5, first particles 21 including metal particles M can be applied, and in the embodiment shown in FIGS. 2 and 3, the metal particles M of a nickel-copper alloy are applied as one example. Specific application examples of the first particles 21 will be described later.

The insulating member 7 is a member which plays a part in covering the functional element section 5 and maintaining the insulation from the outside. Here, the "covering" as used herein is not necessarily used only in the sense of a state where the entire periphery of the functional element section 5 is covered with the insulating member 7, but is used in the sense of including a state where a part of the functional element section 5 is not covered with the insulating member 7 within a range where the function of the functional element section 5 is not affected.

As a material for forming the insulating member 7, second particles 23 having an insulating property can be applied, and in the embodiment shown in FIGS. 2 and 3, ceramic particles C are applied as one example.

The external constituent member 11 is a member to serve as a housing which houses the functional element section 5 and the insulating member 7, and functions as a protective member which protects the functional element section 5 and the insulating member 7 from an external factor.

As a material for forming the external constituent member 11, a synthetic resin material can be applied as one example.

In FIG. 2, a member denoted by a reference numeral 25 is a support member, and is a member which is used for the purpose of supporting the functional element structure body 1 during the production at the stage of producing the functional element structure body 1, and is detached as shown in FIG. 3 after completion of the functional element structure body 1.

Figure 4:
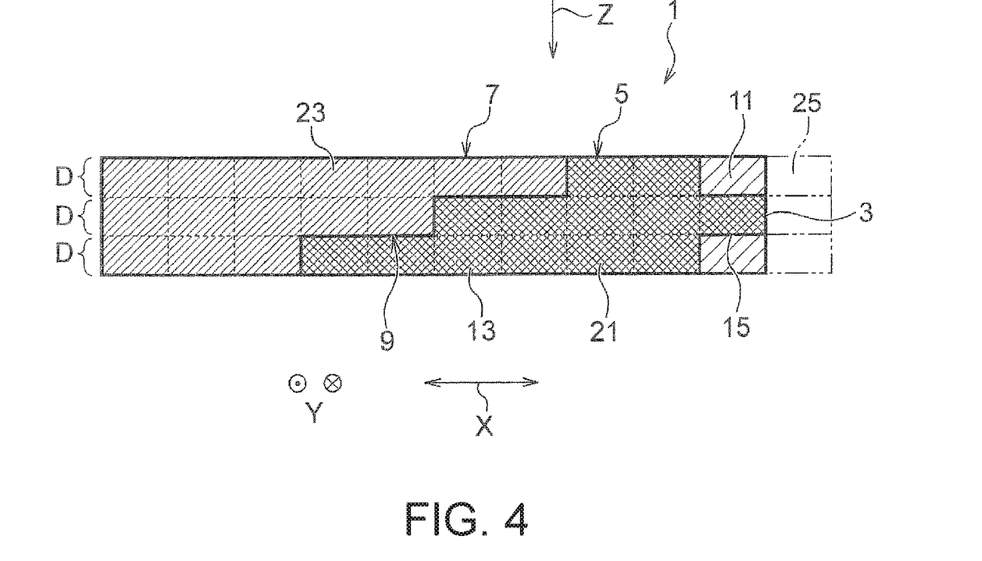
FIG. 4 is an enlarged cross-sectional view of a portion of a functional element structure body according to an embodiment of the invention.

According to the functional element structure body 1 of this embodiment configured as described above, the structure body does not have a structure in which the contact regions 109 of the functional element section 105 and the insulating member 107 are in a state of being merely in surface contact with each other or are bonded to each other with the adhesive B as in the case of the functional element structure body 101 in the related art shown in FIG. 5, but as shown in FIG. 4, the respective materials of the functional element section 5 and the insulating member 7 are systematically connected with each other and thus integrally bonded to each other. As a result, the seams J generated in the functional element structure body 101 in the related art shown in FIG. 5 are not generated in this embodiment, and the functional element structure body 1 has a seamless structure.

Therefore, according to this embodiment, the effect of an external factor which makes the property of the functional element section 5 unstable is decreased, so that the property of the functional element section 5 can be stably exhibited, and deterioration of the adhesive B in the contact regions 109 occurring in the functional element structure body 101 in the related art shown in FIG. 5 can be suppressed.

Figure 6:
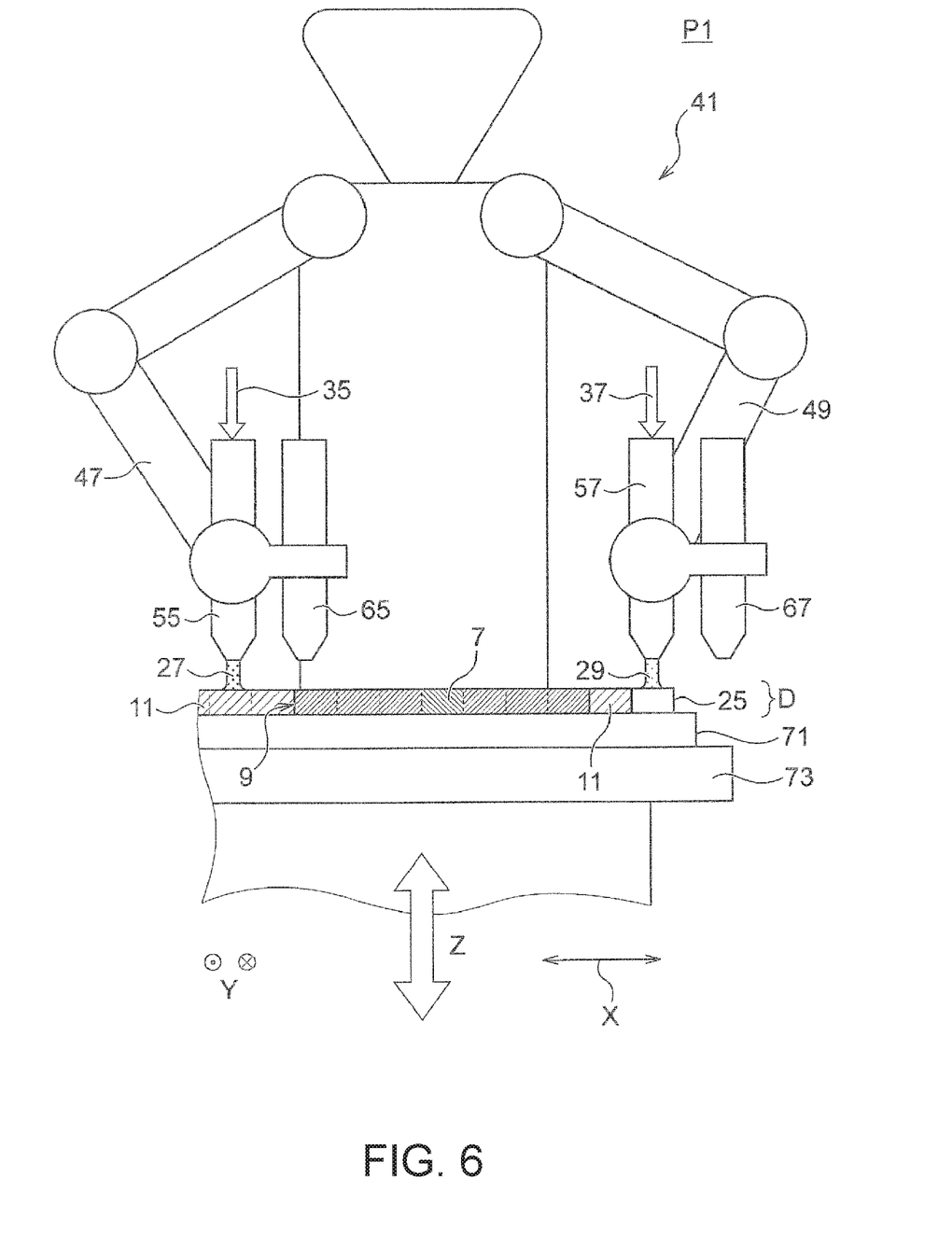
FIG. 6 is an explanatory view showing a layer formation step of a three-dimensional production method for a functional element structure body according to an embodiment of the invention.
Figure 7:
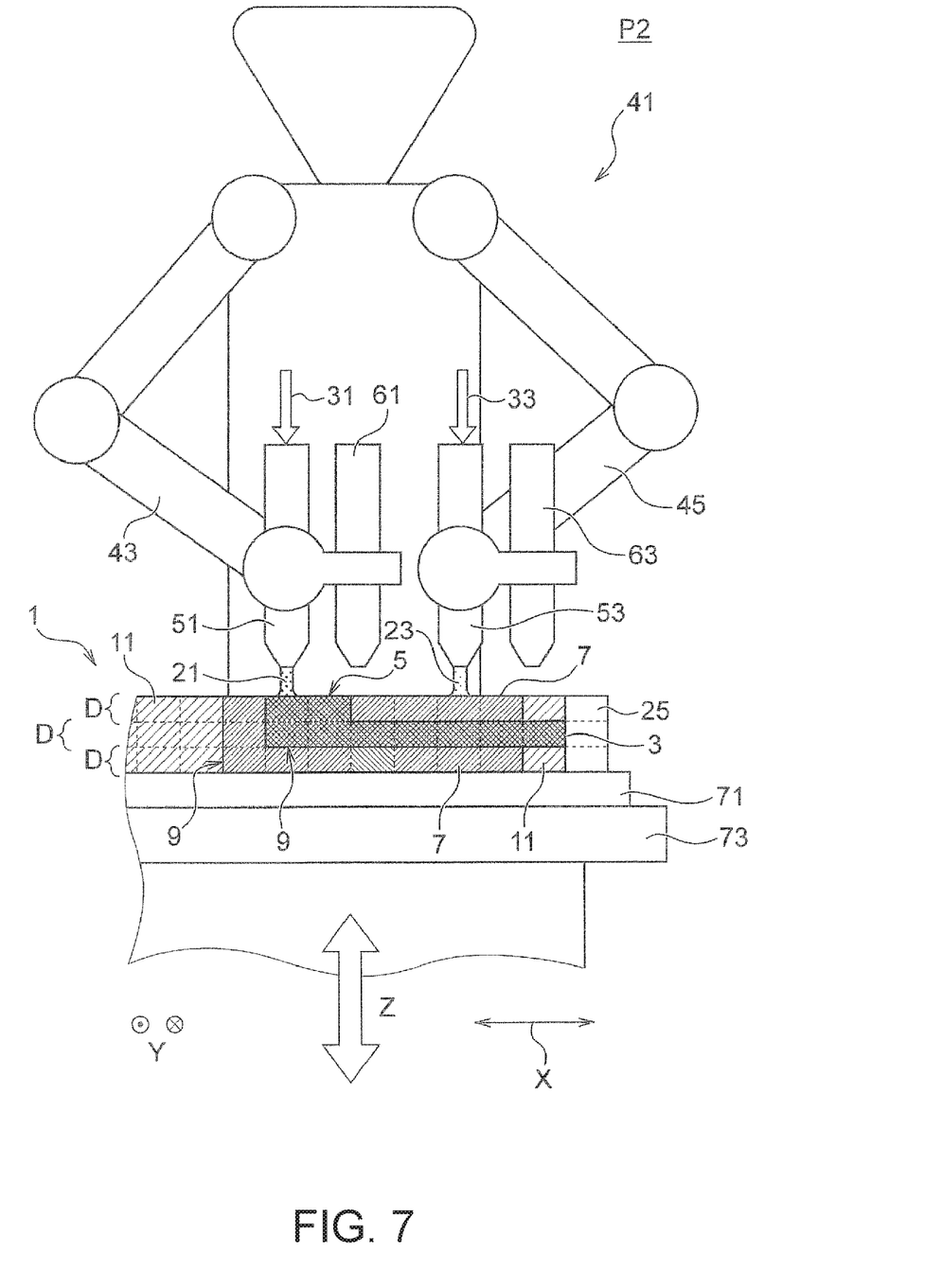
FIG. 7 is an explanatory view showing a shaping step of a three-dimensional production method for a functional element structure body according to an embodiment of the invention.
Figure 8:
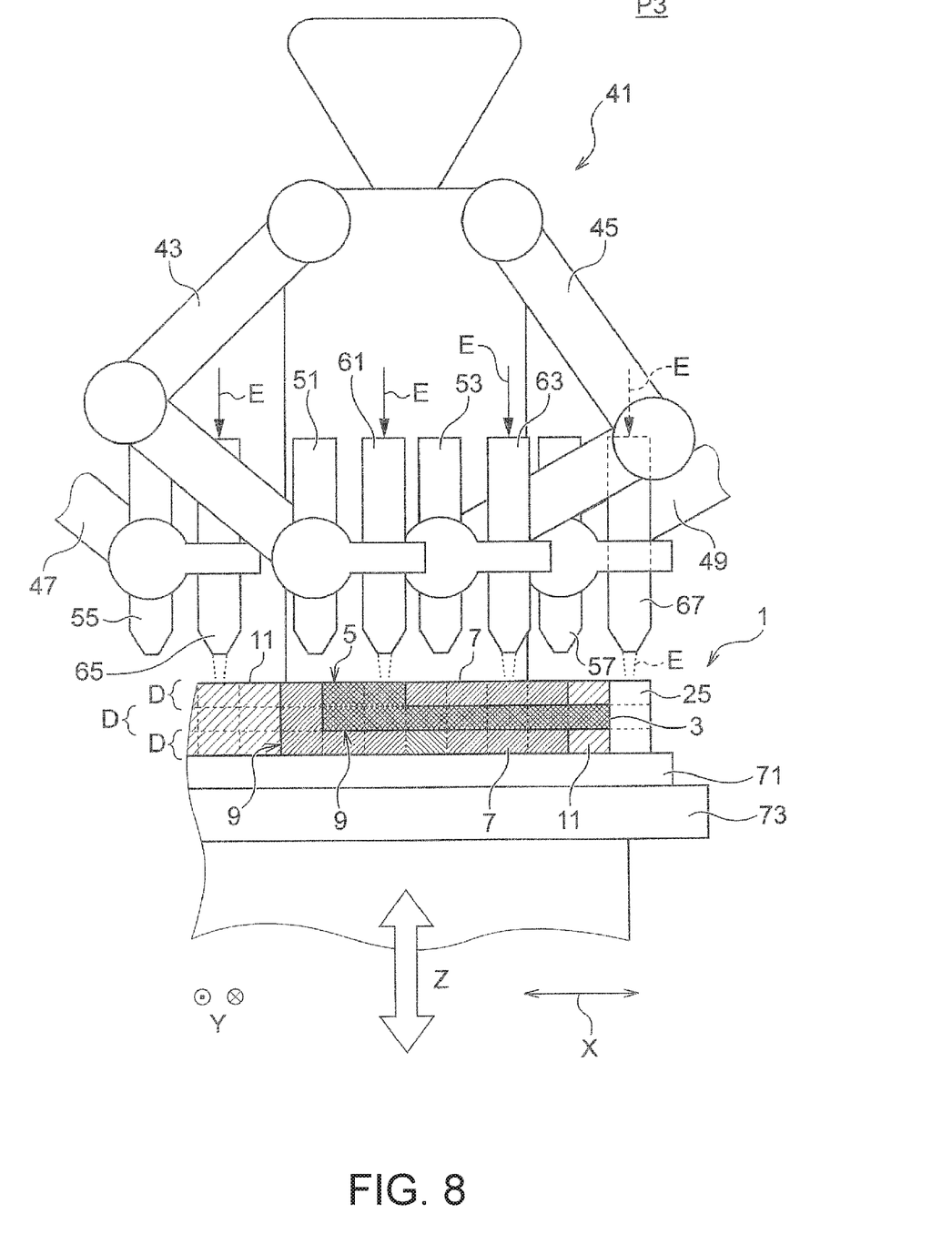
FIG. 8 is an explanatory view showing a solidification step of a three-dimensional production method for a functional element structure body according to an embodiment of the invention.

(2) Schematic Configuration of Three-Dimensional Production Apparatus for Functional Element Structure Body (see FIGS. 6 to 8)

As a three-dimensional production apparatus 41 for a functional element structure body, an articulated industrial robot including a plurality of robot arms 43, 45, 47, and 49 can be adopted as one example.

Specifically, a first ejection head 51 which ejects a first flowable composition 31 containing first particles 21 to serve as a material for the functional element section 5, a second ejection head 53 which ejects a second flowable composition 33 containing second particles 23 to serve as a material for the insulating member 7, a third ejection head 55 which ejects a third flowable composition 35 containing third particles 27 to serve as a material for the external constituent member 11, and a fourth ejection head 57 which ejects a fourth flowable composition 37 containing fourth particles 29 to serve as a material for the support member 25 are included.

These four ejection heads 51, 53, 55, and 57 are one aspect of a first supply section 51, a second supply section 53, a third supply section 55, and a fourth supply section 57, respectively.

The three-dimensional production apparatus 41 for a functional element structure body includes a plurality of irradiation heads 61, 63, 65, and 67 for individually irradiating laser light E to solidify the respective particles 21, 23, 27, and 29 contained in the respective flowable compositions 31, 33, 35, and 37 ejected from these ejection heads 51, 53, 55, and 57, a stage 73 on which the respective flowable compositions 31, 33, 35, and 37 are ejected, and which includes a plate-shaped base plate 71 to serve as one example of a layer forming region on the upper surface thereof, a drive section (not shown) which drives the robot arms 43, 45, 47, and 49 and executes an up-and-down operation in the stacking direction Z of the stage 73, and a control section (not shown) which drives the drive section and performs the control of ejection of the respective flowable compositions 31, 33, 35, and 37 ejected from the ejection heads 51, 53, 55, and 57, and the control of irradiation of the laser light E to be irradiated from the irradiation heads 61, 63, 65, and 67.

The three-dimensional production apparatus 41 for a functional element structure body is configured to include these members as one example.

(3) Contents of Three-Dimensional Production Method for Functional Element Structure Body (see FIGS. 2 to 4 and 6 to 13)

The three-dimensional production method for a functional element structure body according to this embodiment is a three-dimensional production method for a functional element structure body 1 including an electrical functional element section 5 having a terminal 3 and an insulating member 7 provided on the periphery of the functional element section 5 in a state where at least the terminal 3 is exposed to the outside, and is basically configured to include a layer formation step P1, a shaping step P2, and a solidification step P3.

Hereinafter, the contents of the layer formation step P1, the shaping step P2, and the solidification step P3 will be specifically described.

Figure 9:
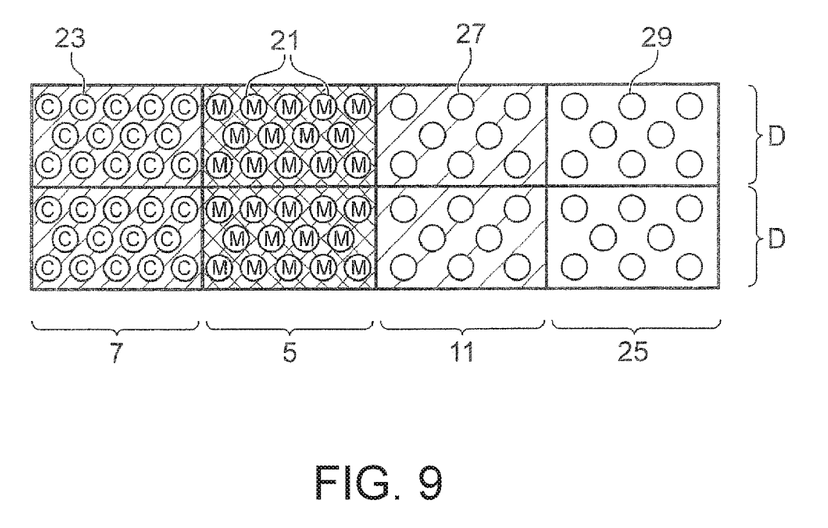
FIG. 9 is an explanatory view showing one example of an embodiment of the compositions of first particles and second particles.
Figure 10:
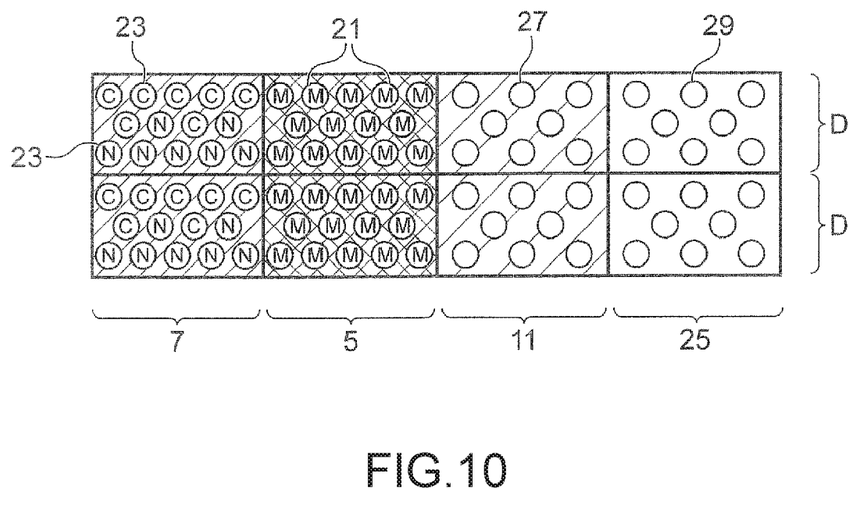
FIG. 10 is an explanatory view showing another example of an embodiment of the compositions of first particles and second particles.

(A) Layer Formation Step (see FIGS. 6, 9, and 10)

As shown in FIG. 6, the layer formation step P1 is a step of forming one layer D on a base plate 71 to serve as a layer forming region by supplying a first flowable composition 31 containing first particles 21 to serve as a material for a functional element section 5 to a predetermined region from a first ejection head 51 to serve as a first supply section (see FIGS. 7 and 8), and also supplying a second flowable composition 33 containing second particles 23 to serve as a material for an insulating member 7 to a predetermined region from a second ejection head 53 to serve as a second supply section (see FIGS. 7 and 8).

In this embodiment, as shown in FIG. 6, the above-mentioned one layer D is formed by supplying a third flowable composition 35 containing third particles 27 to serve as a material for an external constituent member 11 to a predetermined region from a third ejection head 55 to serve as a third supply section, and also supplying a fourth flowable composition 37 containing fourth particles 29 to serve as a material for a support member 25 to a predetermined region from a fourth ejection head 57 to serve as a fourth supply section.

Further, in this embodiment, all of the four supply sections are constituted by the ejection heads 51, 53, 55, and 57, respectively, and all of the four flowable compositions 31, 33, 35, and 37 are configured to be ejected in a liquid droplet state.

In addition, the four supply sections 51, 53, 55, and 57 are not necessarily constituted by the ejection heads, and it is also possible to constitute only one of the first supply section 51 and the second supply section 53 by an ejection head and to constitute the other supply section by another supply unit having a different structure (for example, a coating roller or the like).

The first particles 21 are configured to include metal particles M, and the second particles 23 are configured to include ceramic particles C.

Further, as shown in FIG. 10, it is also possible to configure the second particles 23 to include other than the ceramic particles C, ceramic particles N which are different from the ceramic particles C included in the second particles 23.

In the case where the layers D shown in FIGS. 9 and 10 are formed as shown in the drawings, and a plurality of functional element sections 5 and a plurality of insulating members 7 are arranged in a direction crossing the stacking direction and stacked, by appropriately selecting the types of the ceramic particles C and the ceramic particles N which are different from the ceramic particles C, a new functional element structure body 1 in which a property as a dielectric material is imparted to the insulating member 7 can be produced.

The material of the first particles is determined according to the function required for the functional element 13, however, examples thereof include aluminum, titanium, iron, copper, magnesium, and various types of alloys. The material of the second particles is determined according to the performance required as a material for the insulating member, however, examples thereof include silica, alumina, aluminum nitride, titanium oxide, zinc oxide, zircon oxide, tin oxide, barium titanate, potassium titanate, magnesium oxide, silicon nitride, zirconia, silicon carbide, barium carbonate, lead zirconate titanate, and sodium oxide, and particles containing at least any one component among these can be used.

In the above-mentioned respective flowable compositions 31, 33, 35, and 37, other than the above-mentioned four types of particles 21, 23, 27, and 29, a solvent or a dispersion medium, and a binder are generally contained.

Examples of the solvent or the dispersion medium include various types of water such as distilled water, pure water, and RO water, and other than these, alcohols such as methanol, ethanol, 2-propanol, 1-butanol, 2-butanol, octanol, ethylene glycol, diethylene glycol, and glycerin, ethers (cellosolves) such as ethylene glycol monomethyl ether (methyl cellosolve), esters such as methyl acetate, ethyl acetate, butyl acetate, and ethyl formate, ketones such as acetone, methyl ethyl ketone, diethyl ketone, methyl isobutyl ketone, methyl isopropyl ketone, and cyclohexanone, aliphatic hydrocarbons such as pentane, hexane, and octane, cyclic hydrocarbons such as cyclohexane and methylcyclohexane, aromatic hydrocarbons having a long-chain alkyl group and a benzene ring such as benzene, toluene, xylene, hexylbenzene, heptylbenzene, octylbenzene, nonylbenzene, decylbenzene, undecylbenzene, dodecylbenzene, tridecylbenzene, and tetradecylbenzene, halogenated hydrocarbons such as methylene chloride, chloroform, carbon tetrachloride, and 1,2-dichloroethane, aromatic heterocycles such as pyridine, pyrazine, furan, pyrrole, thiophene, and methylpyrrolidone, nitriles such as acetonitrile, propionitrile, and acrylonitrile, amides such as N,N-dimethylamide and N,N-dimethylacetamide, carboxylates, and other various types of oils.

The binder is not limited as long as it is soluble in the above-mentioned solvent or dispersion medium. For example, an acrylic resin, an epoxy resin, a silicone resin, a cellulosic resin, a synthetic resin, or the like can be used. Further, for example, a thermoplastic resin such as polylactic acid (PLA), polyamide (PA), or polyphenylene sulfide (PPS) can also be used.

In addition, the above-mentioned resin such as an acrylic resin may be dispersed in the above-mentioned solvent or dispersion medium in a fine particle state instead of in a soluble state.

(B) Shaping Step (see FIGS. 2, 4, and 7)

The shaping step P2 is a step of shaping the functional element structure body 1 by repeating the layer formation step P1 in the stacking direction Z.

In this embodiment, all of the above-mentioned four flowable compositions 31, 33, 35, and 37 are ejected in a liquid droplet state onto the layer forming region 71, and therefore, the existing ratio of the respective materials in the contact regions 9 of the functional element section 5 and the insulating member 7 can be changed for each layer D.

Therefore, as shown in FIG. 4, in the case where each layer D is formed by ejecting the compositions such that the existing ratio of the first particles 21 for the functional element section 5 is gradually decreased toward the insulating member 7 side and the existing ratio of the other second particles 23 for the insulating member 7 is gradually decreased toward the functional element section 5 side, the first particles 21 and the second particles 23 can be made to exist in a gradient state in the contact regions 9 of these members.

(C) Solidification Step (see FIGS. 3, 8, and 11 to 13)

The solidification step P3 is a step of performing solidification by applying energy E to the first particles 21 and the second particles 23 in the layer D. In this embodiment, as the unit for applying the energy E, the above-mentioned four irradiation heads 61, 63, 65, and 67 are provided, and it is configured such that the solidification step P3 can be performed every time when the layer D is formed by the laser light E irradiated from these irradiation heads 61, 63, 65, and 67.

Further, it is possible to set the melting point of the second particles 23 to serve as a material for the insulating member 7 to be higher than the melting point of the first particles 21 to serve as a material for the functional element section 5.

In the case where the melting points of these materials are set as described above, in this step P3, it is possible to sinter the insulating member 7 on the periphery and to melt and solidify the functional element section 5 in the inside. In this manner, the application of the energy E in the solidification step P3 can be effectively performed according to the type of material.

Further, the support member 25 is no longer needed after completion of the functional element structure body 1, and therefore is removed as shown in FIG. 3. Accordingly, it can also be configured such that the output of the laser light E irradiated from the fourth irradiation head 67 is decreased or the irradiation of the laser light E is stopped.

The functional element section 5 in the functional element structure body 1 produced in this manner may include a passive element 17 as shown in FIG. 11 (a resistor in the embodiment shown in the drawing) as the functional element 13, or may include an active element 19 as shown in FIG. 12 (a diode in the embodiment shown in the drawing) as the functional element 13. Further, it can also be configured such that the functional element section 5 includes a plurality of functional elements 13 including a passive element 17 and an active element 19 as shown in FIG. 13 (a resistor and a diode in the embodiment shown in the drawing) as the functional element 13.

According to the three-dimensional production method for a functional element structure body of this embodiment configured as described above, the first particles 21 and the second particles 23 constituting the respective materials of the functional element section 5 and the insulating member 7 housed in the external constituent member of the functional element structure body 1 are systematically connected with each other and thus integrally bonded to each other without seams J.

According to this, the functional element section 5 is reliably and stably held, and the adhesive B is not needed in the bond part, and therefore, deterioration of the adhesive B over time does not occur. In addition, the property of the functional element section 5 is stably exhibited, and the production is easy and the number of assembling workloads can be decreased, and therefore, the increase in the cost of the functional element structure body 1 can be suppressed.

Other Embodiments

The three-dimensional production method for a functional element structure body and the functional element structure body 1 according to the invention basically have the configurations as described above, however, of course, it is also possible to perform change, omission, or the like of a partial configuration without departing from the gist of the invention of this application.

For example, by constituting the first particles 21 to serve as a material for the functional element section 5 by a plurality of different types of metal particles M, and ejecting a plurality of flowable compositions 31 including the plurality of different types of metal particles M from the individual different ejection heads 51, respectively, the functional element section 5 having a seamless structure in which the plurality of different types of metal particles M are integrally connected with each other can be formed.

Further, the three-dimensional production apparatus 41 for a functional element structure body to be used for the production of the functional element structure body 1 according to the invention is not limited to an articulated industrial robot having the above-mentioned configuration, and various production apparatuses having different configurations such as a slide table type industrial robot provided with a table which slides in the width direction X, the depth direction Y, and the stacking direction Z, and a cylindrical coordinate industrial robot can be applied.

In addition, the above-mentioned solidification step P3 is performed every time when each layer D is formed, however, other than this, it is also possible to place the formed functional element structure body 1 before solidification after forming all layers D in, for example, a sintering furnace and to perform solidification all at once.

The entire disclosure of Japanese patent No. 2016-012611, filed Jan. 26, 2016 is expressly incorporated by reference herein.

What is claimed is:

1. A three-dimensional production method for a functional element structure body, wherein
the functional element structure body includes an electrical functional element section having a terminal and an insulating member provided on the periphery of the functional element section in a state where at least the terminal is exposed to the outside of the insulating member, the terminal being configured to function as an electrical contact point to connect the electrical functional element to a power supply, and the electrical functional element section being configured to include at least one of a heater, a resistor, a capacitor, a strain sensor, and a transistor, and
the method comprises:
a layer formation step of forming one layer in a layer forming region by supplying a first flowable composition containing first particles to serve as a material for the functional element section from a first supply section to a first predetermined region, and supplying a second flowable composition containing second particles to serve as a material for the insulating member from a second supply section to a second predetermined region, the melting point of the second particles being higher than the melting point of the first particles, the first predetermined region and the second predetermined region in a same layer configured not to overlap or penetrate each other;
a shaping step of shaping the functional element structure body by repeating the layer formation step in a stacking direction, wherein a subsequent layer of the functional element section is stacked in the stacking direction on a previous layer of the functional element section; and
a solidification step of performing solidification by applying first energy to the first flowable composition in the first predetermined region from a first irradiation head, and applying second energy to the second flowable composition in the second predetermined region from a second irradiation head,
wherein the first supply section and the first irradiation head are held by a first holding unit, and the second supply section and the second irradiation head are held by a second holding unit.

2. The three-dimensional production method for a functional element structure body according to claim 1, wherein at least one of the first supply section and the second supply section ejects the flowable composition in a liquid droplet state.

3. The three-dimensional production method for a functional element structure body according to claim 1, wherein the first particles include metal particles, and the second particles include ceramic particles.

4. The three-dimensional production method for a functional element structure body according to claim 3, wherein the second particles include ceramic particles and other ceramic particles different from the ceramic particles.

5. The three-dimensional production method for a functional element structure body according to claim 1, wherein the solidification step is performed every time when each layer is formed.

6. The three-dimensional production method for a functional element structure body according to claim 1, wherein the functional element section has a passive element as the functional element.

7. The three-dimensional production method for a functional element structure body according to claim 1, wherein the functional element section has an active element as the functional element.

8. The three-dimensional production method for a functional element structure body according to claim 1, wherein the functional element section has a plurality of functional elements including a passive element and an active element as the functional element.

9. The three-dimensional production method according to claim 1, wherein:
at least one of the first supply section or the second supply section is coupled to an irradiation head that is configured to move with the corresponding supply section and supply energy to the corresponding flowable composition supplied by the corresponding supply section, and
the solidification step is performed by the irradiation head that is coupled to the at least one of the first supply section or the second supply section.

* * * * *